(12) United States Patent
Kadota

(10) Patent No.: US 6,429,569 B1
(45) Date of Patent: Aug. 6, 2002

(54) SURFACE ACOUSTIC WAVE DEVICE AND COMMUNICATION APPARATUS

(75) Inventor: Michio Kadota, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/613,777

(22) Filed: Jul. 11, 2000

(30) Foreign Application Priority Data

Jul. 22, 1999 (JP) .......................................... 11-207820

(51) Int. Cl.[7] .............................................. H01L 41/08
(52) U.S. Cl. .............................. 310/313 R; 310/313 B; 310/313 D
(58) Field of Search ........................ 310/313 A, 313 B, 310/313 D, 313 R; 333/150–154, 193–196

(56) References Cited

U.S. PATENT DOCUMENTS

| | | | |
|---|---|---|---|
| 4,204,178 A | 5/1980 | Mitchell | ..................... 333/194 |
| 4,349,794 A * | 9/1982 | Kagiwada et al. | ........... 333/141 |
| 5,886,452 A * | 3/1999 | Toda | ....................... 310/313 R |
| 5,977,686 A * | 11/1999 | Kadota et al. | .......... 310/313 B |
| 6,127,769 A * | 10/2000 | Kadota et al. | .......... 310/313 R |
| 6,218,763 B1 * | 4/2001 | Fujimoto et al. | ....... 310/313 B |

* cited by examiner

Primary Examiner—Mark O. Budd
(74) Attorney, Agent, or Firm—Keating & Bennett, LLP

(57) ABSTRACT

A surface acoustic wave device includes a piezoelectric substrate, a first interdigital transducer, a second interdigital transducer and a first coupler. The first and second interdigital transducers are,arranged on the surface of the piezoelectric substrate such that the second interdigital transducer is offset from a direction in which a surface acoustic wave excited by the first IDT propagates. A first edge is provided on the piezoelectric substrate to reflect the excited surface acoustic wave to the first and second interdigital transducers, and the first coupler having a plurality of metal strips on the piezoelectric substrate is provided between the first edge of the piezoelectric substrate and at least one of the first and second interdigital transducers so as to be adjacent to the first and second interdigital transducers. The surface acoustic wave device operates using a shear horizontal surface wave.

13 Claims, 8 Drawing Sheets

SURFACE ACOUSTIC WAVE DEVICE AND COMMUNICATION APPARATUS

BACKGROUND OF THE INVENTION

1. Field of the Invention

The present invention relates to a surface acoustic wave device such as a surface acoustic wave filter using a resonator and a coupler such as a multistrip coupler, directional coupler, or other suitable coupler. More specifically, the present invention relates to a surface acoustic wave device having low loss and a satisfactory shape factor, and a communication apparatus incorporating the same.

2. Description of the Related Art

Conventionally, a surface acoustic wave filter is known as an IF filter used in a mobile communication apparatus. Such a surface acoustic wave filter includes a known dual-mode surface acoustic wave resonator filter having a longitudinal coupling and a lateral coupling. In the double-mode surface acoustic wave resonator filter, because the pass bandwidth of the filter is significantly affected by an electromechanical coupling coefficient of a piezoelectric substrate defining the surface acoustic wave filter, it is impossible to substantially change the pass bandwidth of the filter by the changing the arrangement and structure of electrodes used in an IDT (interdigital transducer) and a reflector.

Recently, attention has been focused on surface acoustic wave filters, in which multistrip couplers are incorporated to change the pass bandwidths of the filters by changing the arrangement and structure of electrodes used in IDTs and reflectors, in addition to electromechanical coupling coefficients.

FIG. 11 is a plan view showing a surface acoustic wave filter 101 using a multistrip coupler.

As shown in FIG. 11, a first IDT 103, a second IDT 104, a multistrip coupler 105 and reflectors 103a, 103b, 104a, and 104b are provided on a piezoelectric substrate 102.

One of the comb-shaped electrodes of the first IDT 103 is connected to an input terminal 106, and the other one thereof is grounded. One of the comb-shaped electrodes of the second IDT 104 is connected to an output terminal 107, and the other one thereof is grounded.

The multistrip coupler 105 includes a plurality of strip lines, and is located on the right side in FIG. 11 so as to cover the area from the first IDT 103 to the second IDT 104.

The reflectors 103a and 103b are disposed in a surface-wave propagating direction in such a manner that the first IDT 103 and the multistrip coupler 105 are positioned between the reflectors 103a and 103b. The reflectors 104a and 104b are disposed in a surface-wave propagating direction in such a manner that the second IDT 104 and the multistrip coupler 105 are positioned between the reflectors 104a and 104b.

The reflectors of the surface acoustic wave filter described above have specified frequency characteristics. Therefore, when it is necessary to adjust the frequency characteristics of the reflectors to the frequency characteristics of the IDTs, a number of reflectors are required. For example, in the case of frequencies from 100 to 300 MHz, approximately 80 reflectors are necessary.

In addition, in the case of the surface acoustic wave filter described above, because the number of the reflectors is increased and the lengths of the reflectors are thereby increased, the deviation of group-delay time characteristics increases.

In other words, as shown in FIG. 12, there is a tendency for both ends of group-delay time characteristics D in the pass band of the filter frequency characteristics C to increase, the surface acoustic wave signal detected at an output electrode delays such that the deviation of the characteristics D is approximately 0.5 $\mu$S.

In addition, as the deviation of the group-delay time characteristics increases, the phase of a signal substantially changes. As a result, no proper response with respect to an input signal can be obtained. Therefore, in a communication apparatus incorporating the surface acoustic wave device, for example, in a communication apparatus such a cellular phone, even though a radio wave is received, there is a possibility that voice is cut off or no voice is output while talking over the phone.

Furthermore, since the lengths of the reflectors are increased, the dimensions of the overall surface acoustic wave device, such as a surface acoustic wave filter, are also increased. This is prevents miniaturization of the surface acoustic wave device.

SUMMARY OF THE INVENTION

To overcome the problems described above, preferred embodiments of the present invention provide a surface acoustic wave device in which the deviation of group-delay time characteristics is reduced and miniaturization of the device is facilitated.

A surface acoustic wave device according to a preferred embodiment of the present invention includes a piezoelectric substrate, a first interdigital transducer, a second interdigital transducer and a first coupler.

The first and second interdigital transducers are arranged on the surface of the piezoelectric substrate such that the second interdigital transducer is offset from a direction in which a surface acoustic wave excited by the first IDT propagates. A first edge is provided on the piezoelectric substrate to reflect the excited surface acoustic wave to the first and second interdigital transducers, and the first coupler having a plurality of metal strips on the piezoelectric substrate is provided between the first edge of the piezoelectric substrate and at least one of the first and second interdigital transducers so as to be adjacent to the first and second interdigital transducers. The surface acoustic wave device operates using a shear horizontal surface wave.

A surface acoustic wave device according another preferred embodiment of the present invention further includes a second coupler on the piezoelectric substrate arranged such that the first and second couplers interpose the first and second interdigital transducers.

A surface acoustic wave device according to yet another preferred embodiment of the present invention further includes a third interdigital transducer between the first coupler and the second coupler.

A surface acoustic wave device according to still another preferred embodiment of the present invention further includes a second edge on the piezoelectric substrate. The second edge is located on the side of at least one of the first and second interdigital transducers where first coupler is not provided, and the second edge is not perpendicular to the surface acoustic wave propagating direction.

The surface acoustic wave device further includes a resin film covering the first and second interdigital transducers.

The surface acoustic wave device may be incorporated in a communication apparatus or other electronic device.

According to preferred embodiments of the present invention, because the coupler is used to reflect a surface acoustic wave on a reflection end surface, group-delay time characteristics are flat, and the deviation of the group-delay time characteristics is thereby small. In addition, because loss occurring at a reflecting portion on the reflection end surface is suppressed more than that at a reflector, insertion loss is substantially reduced. Furthermore, since the reflecting portion on the reflection end surface is used instead of the reflector, miniaturization of the device is greatly facilitated.

Other features, characteristics, elements and advantages of the present invention will become apparent from the following description of preferred embodiments thereof with reference to the attached drawings.

DETAILED DESCRIPTION OF PREFERRED EMBODIMENTS

Hereinafter, preferred embodiments of the present invention are explained in detail with reference to the drawings.

Figure 1:
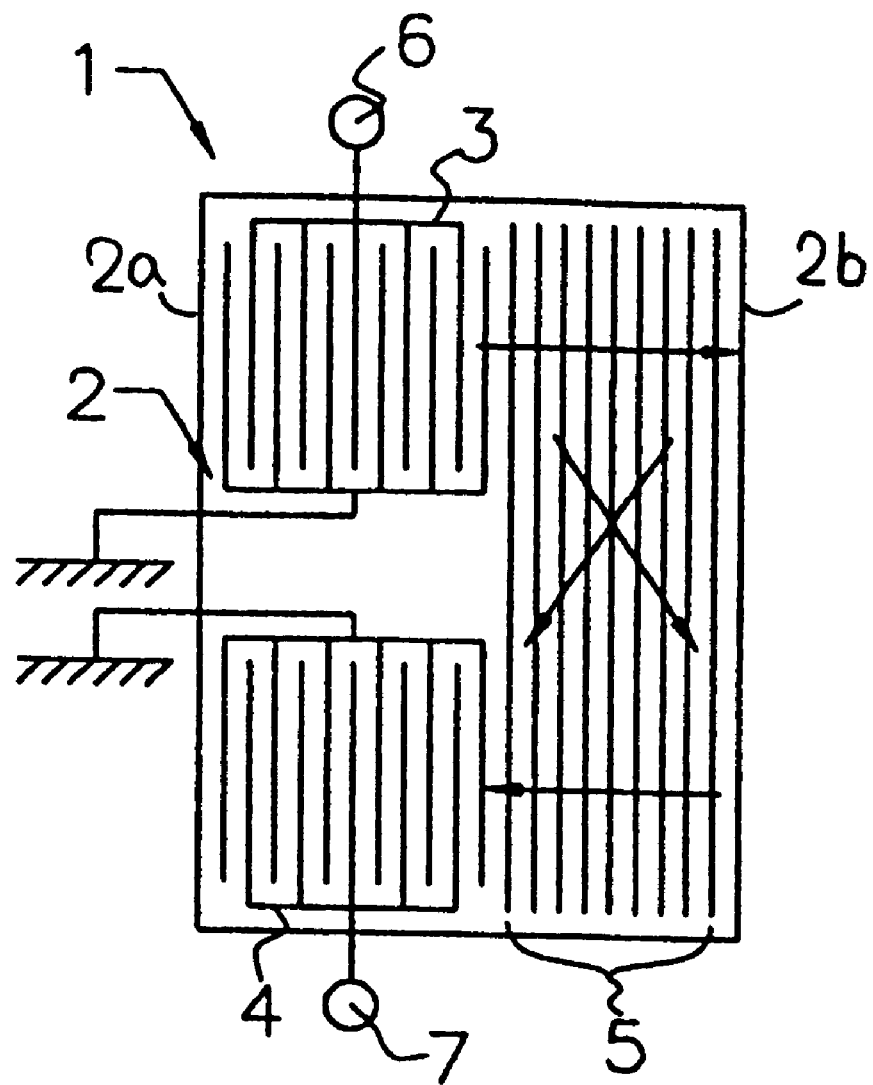
FIG. 1 is a plan view of a surface acoustic wave filter according to a first preferred embodiment of the present invention.

FIG. 1 is a plan view of a surface acoustic wave filter according to a first preferred embodiment of the present invention.

A surface acoustic wave filter 1 operates using a shear horizontal wave such as Love wave, a BGS (Bleustein-Gulyaev-Shimizu) wave, leaky wave or other suitable shear horizontal wave.

The surface acoustic wave filter 1 includes a piezoelectric substrate 2, a first IDT 3, a second IDT 4 and a multistrip coupler 5. The first IDT 3, the second IDT 4 and the multistrip coupler 5 are preferably made of an electrode material such as aluminum, or other suitable material, and disposed on the piezoelectric substrate 2.

The first IDT 3 and the second IDT 4 have respective tracks which are substantially perpendicular to the direction in which electrode fingers of the respective IDTs 3 and 4 extend. Surface acoustic waves excited by the IDT 3 or the IDT 4 or the surface acoustic waves to be received by the IDT 3 or the IDT 4 propagate along the tracks.

The first IDT 3 and the second IDT 4 are arranged on the piezoelectric substrate such that the respective tracks of the IDTs 3 and 4 do not coincide. That is, the IDT 4 is offset from the direction in which the surface acoustic waves excited by or to be received by the IDT 3 propagate.

Each of the IDTs 3 and 4 includes a pair of comb-shaped electrodes. One of the comb-shaped electrodes of the first IDT 3 is connected to an input terminal 6, and the other comb-shaped electrode thereof is grounded. One of the comb-shaped electrodes of the second IDT 4 is connected to an output terminal 7, and the other comb-shaped electrode thereof is grounded.

The multistrip coupler 5 includes a plurality of strip lines made of a metal film such as Al film, or other suitable material, and arranged on the piezoelectric substrate 2 to be adjacent to the IDT 3 and the IDT 4. As a result, the multistrip coupler 5 overlaps the tracks of the IDT 3 and the IDT 4. More specifically, in the case of surface acoustic wave device 1, the multistrip coupler 5 is located on the right side of the IDT 3 and the IDT 4.

A width of each strip line and a space between the strip line of the multistrip coupler 5 are adjusted at a value greater than $\lambda/8$ and less than $\lambda/4$, where $\lambda$ is a wavelength of a surface acoustic wave excited by the IDTs 3 and 4, so that the surface acoustic wave propagating into the multistrip coupler 5 is not reflected by the multistrip coupler 5. A length of multistrip coupler 5 in which the surface acoustic wave propagates is so adjusted that the surface acoustic wave propagating in the track of the IDT 3 travels efficiently into the track of the IDT 4. A method to design a multistrip coupler having desired characteristics is well known to the person skilled in the art.

On the left side of the first and second IDTs 3 and 4 shown in FIG. 1 and the right side of the multistrip coupler 5 shown in FIG. 1, edges 2a and 2b of the piezoelectric substrate 2 are provided. The edges 2a and 2b reflect the surface acoustic waves to the IDT 3 and the IDT 4. Where the sum of the width of the strip line and the space between the strip lines of the multistrip coupler 5 is set at a distance W, it is preferable that the edge 2b is positioned at approximately a W/2 or an integer multiple of W/2 from the center of the strip line closest to the edge 2b so as to improve reflection at the edge 2b. The edge 2b may be flush with the outermost strip line of the multistrip coupler 5. In this case, the outermost strip line preferably has a width not equal to W/4.

In the surface acoustic wave filter 1, acoustic energy propagates as indicated by the arrows in FIG. 1. In other words, when a signal is input from an input terminal 6, the first IDT 3 is excited and acoustic energy is thereby propagated through the multistrip coupler 5. The propagated acoustic energy is reflected on the edge 2b, and the reflected energy enters into the second IDT 4 to be output from an output terminal 7.

Figure 2:
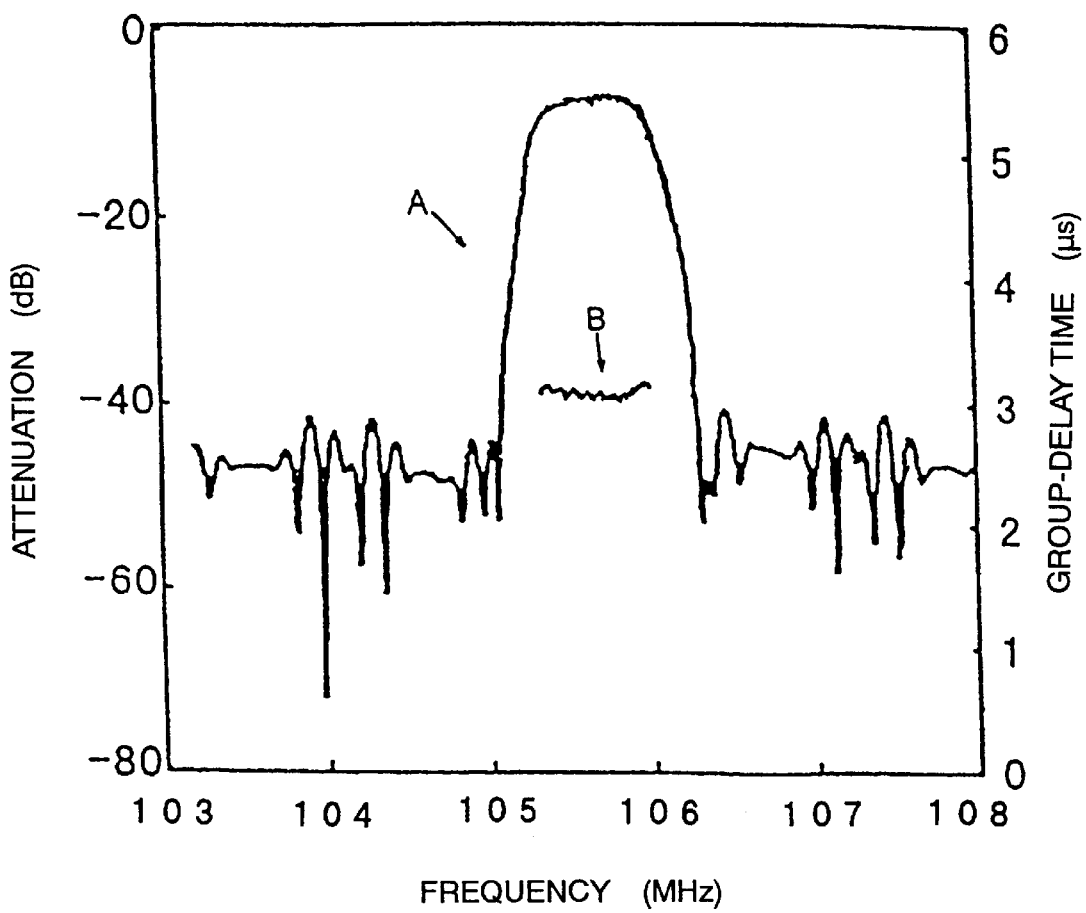
FIG. 2 is a characteristic chart illustrating the frequency characteristics and group-delay time characteristics of the surface acoustic wave filter according to the first preferred embodiment.

Next, a description will be given of the frequency characteristics of the above-described surface acoustic wave filter 1. FIG. 2 is a chart of frequency characteristics measured under the same condition as that of the conventional surface acoustic wave filter 101 having the reflectors as shown in FIG. 12.

Figure 12:
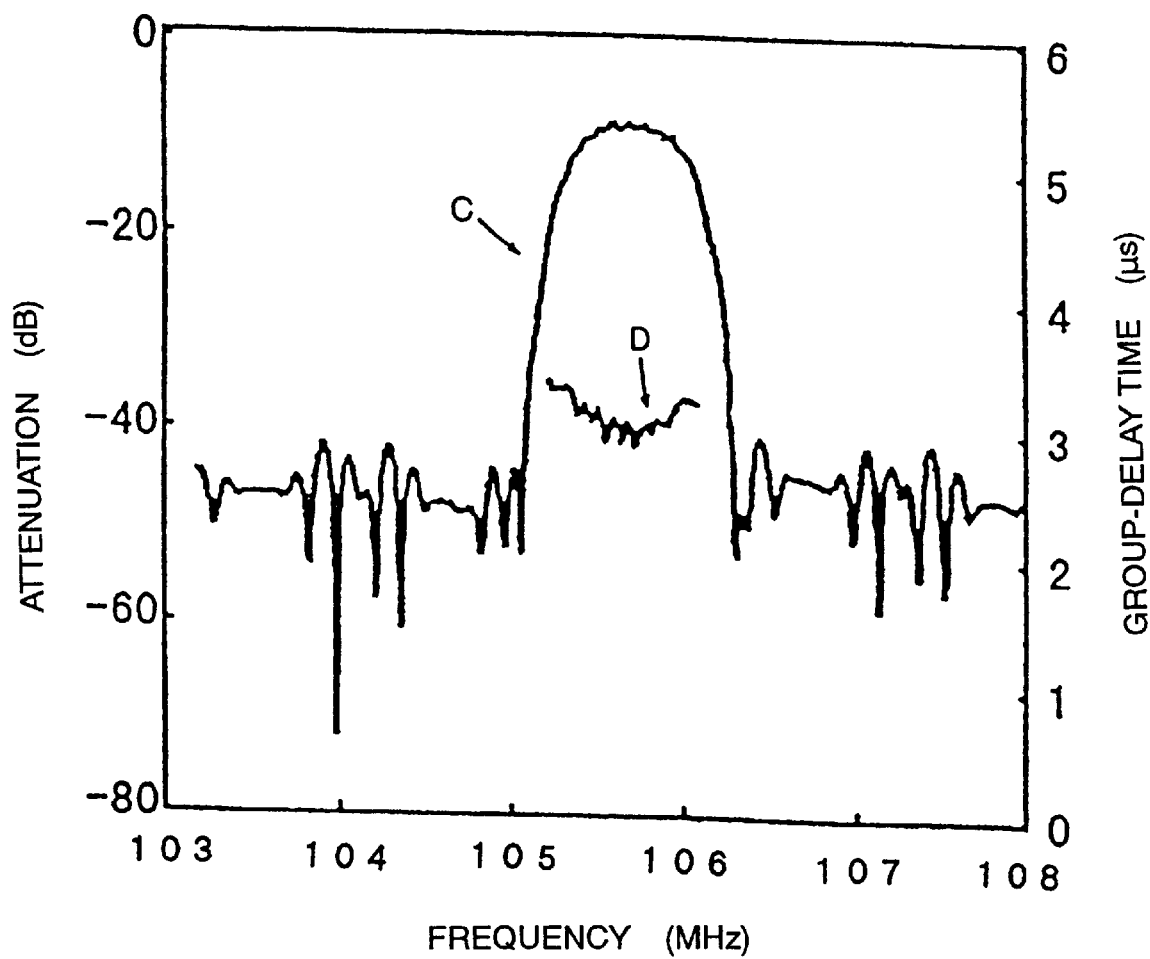
FIG. 12 is a characteristic chart illustrating the frequency characteristics and group-delay time characteristics of the conventional surface acoustic wave filter using the conventional multistrip coupler.

As shown in FIG. 2, when compared with the conventional surface acoustic wave filter 101 having the reflectors as shown in FIG. 12, group-delay time characteristics B in the pass band of the frequency characteristics A of the filter is flat, and the deviation of the group-delay time characteristics B is small, which is approximately 0.15 $\mu$s. In addition, because loss occurring at a reflecting portion on the reflection end surface is substantially less than that occurring at the reflector, insertion loss in the pass band of the frequency characteristics A is reduced by 2 dB to 3 dB.

Figure 3:
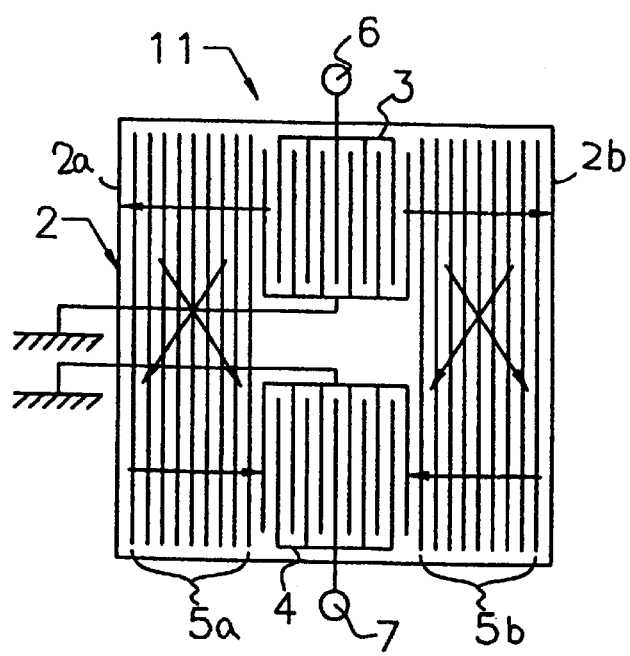
FIG. 3 is a plan view of a surface acoustic wave filter according to a first modification of the first preferred embodiment of the present invention.

Next, a first modification of the first preferred embodiment of the present invention will be illustrated with reference to FIG. 3. FIG. 3 is a plan view of a surface acoustic wave filter 11 according to the first modification. The same reference numerals are given to the same structural elements as those of the surface acoustic wave filter 1 shown in FIG. 1, and the detailed explanation thereof is omitted.

Unlike the structure of the surface acoustic wave filter 1 shown in FIG. 1, in this modification, multistrip couplers 5a and 5b are provided on both sides of the first IDT 3 and the second IDT 4, respectively. More specifically, the IDT 3 and the IDT 4 are interposed between the multistrip couplers 5a and 5b so that the tracks of the IDT 3 and the IDT 4 overlap the multistrip couplers 5a and 5b. The multistrip coupler 5b of the surface acoustic wave device 11 corresponds to the multistrip coupler 5 of the surface acoustic wave device 1. In addition, the multistrip coupler 5b is arranged on the piezoelectric substrate 2 such that the distance between the edge 2a and the center of the electrode finger of the multistrip coupler 5b closest to the edge 2a is set at a value as explained above.

In this way, by providing the multistrip couplers 5a and 5b on both sides of the first and second IDTs 3 and 4, coupling between the first and second IDTs 3 and 4 is facilitated. In other words, because acoustic energy propagates through dual channels as indicated by the arrows shown in FIG. 3, a signal input from an input terminal 6 is efficiently output from an output terminal 7.

With this structure, as compared with the surface acoustic wave filter 1 in which the multistrip coupler 5 is provided only on one side as shown in FIG. 1, insertion loss of about 10 dB occurring in the pass band of the filter 1 is reduced by about 5 to 6 dB. Eventually, the insertion loss is reduced to about 5 dB.

Figure 4:
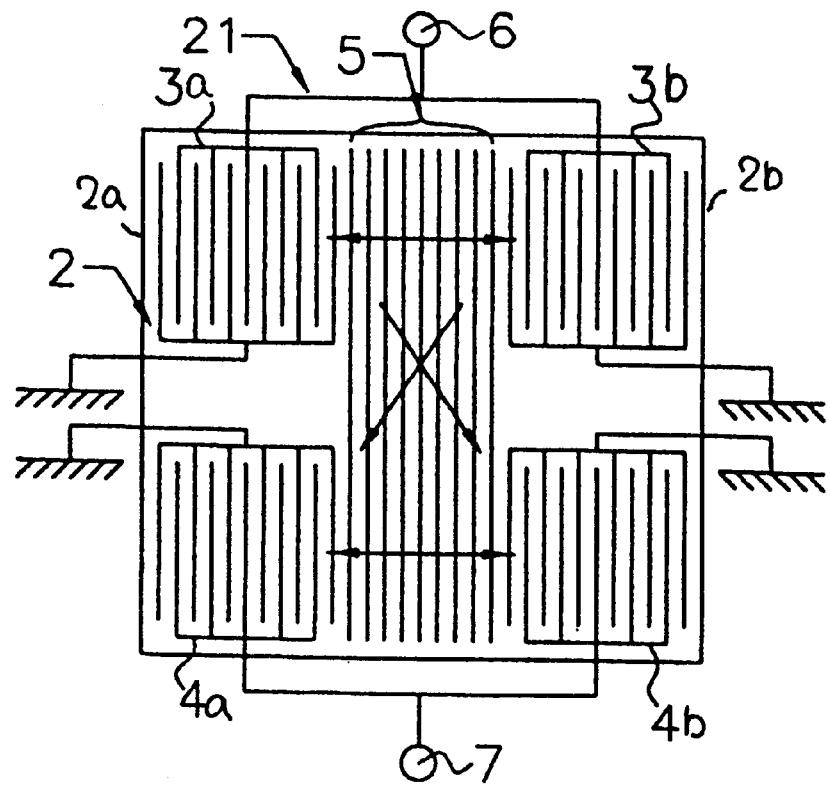
FIG. 4 is a plan view of a surface acoustic wave filter according to a second modification of the first preferred embodiment of the present invention.

Next, a second modification of the first preferred embodiment of the present invention will be illustrated with reference to FIG. 4. FIG. 4 is a plan view of a surface acoustic wave filter 21 according to the second modification. The same reference numerals are given to the same structural elements as those of the surface acoustic wave filter 1 shown in FIG. 1, and the detailed explanation thereof is omitted.

Unlike the structure of the surface acoustic wave filter 1 shown in FIG. 1, in this modification, first IDTs 3a and 3b and second IDTs 4a and 4b are provided on the piezoelectric substrate 2 such that a multistrip coupler 5 is disposed between the first IDTs 3a and 3b and second IDTs 4a and 4b.

In this way, by placing the multistrip coupler 5 between the first IDTs 3a and 3b, and the second IDTs 4a and 4b, coupling between the first IDTs 3a and 3b and the second IDTs 4a and 4b is facilitated. In other words, since surface acoustic energy propagates through the multistrip coupler 5 as indicated by the arrows shown in FIG. 4, a signal input from an input terminal 6 is efficiently output from an output terminal 7.

With such a structure, as compared with the surface acoustic wave filter 1 having a single first IDT 3 and a single second IDT 4, insertion loss occurring in the pass band of the filter is greatly reduced.

Figure 5:
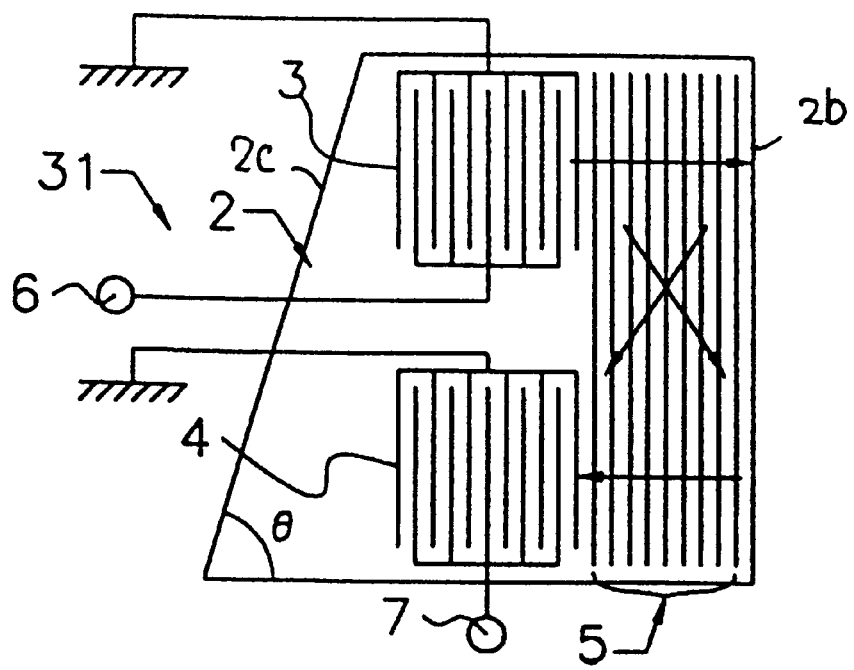
FIG. 5 is a plan view of a surface acoustic wave filter according to a third modification of the first preferred embodiment of the present invention.

Next, a third modification of the first preferred embodiment of the present invention will be illustrated with reference to FIG. 5. FIG. 5 is a plan view of a surface acoustic wave filter 31 according to the third modification. The same reference numerals are given to the same structural elements as those of the surface acoustic wave filter 1 shown in FIG. 1, and the detailed explanation thereof is omitted.

Unlike the structure of the surface acoustic wave filter 1 shown in FIG. 1, in this modification, an edge 2c on the side where no multistrip coupler is located is provided on piezoelectric substrate 2 at an angle $\theta$ ($\theta \neq 90°$) with respect to a surface-wave propagating direction.

When only the edge 2b on the side where the multistrip coupler 5 is provided is used as a reflection edge with respect to a first IDT 3 and a second IDT 4, insertion loss is slightly greater than that generated in the case in which both sides of the IDTs 3 and 4 are used as the reflection edges. However, the reflection edge cannot provide satisfactory reflection characteristics unless the reflection edge is disposed in a position appropriate for the multistrip coupler 5, the first IDT3, and the second IDT 4. Thus, it is important to precisely position the reflection edge. When the reflection edge is not disposed in an appropriate position, unnecessary reflection occurs, resulting in unnecessary, spurious reflection waves.

Thus, as shown in FIG. 5, the edge 2b on the side where the multistrip coupler 5 is provided, greatly effecting filter characteristics, is used as a reflection edge. Meanwhile, the edge 2c on the side opposing the side where the multistrip coupler 5 is provided is set at the angle $\theta$ ($\theta \neq 90°$) with respect to a surface-wave propagating direction so that the edge on the opposite side does not need to be precisely positioned and unnecessary, spurious reflection waves are not reflected by the first and second IDTs. The structure of this modification reduces unnecessary spurious reflection waves and loss.

Figure 6:
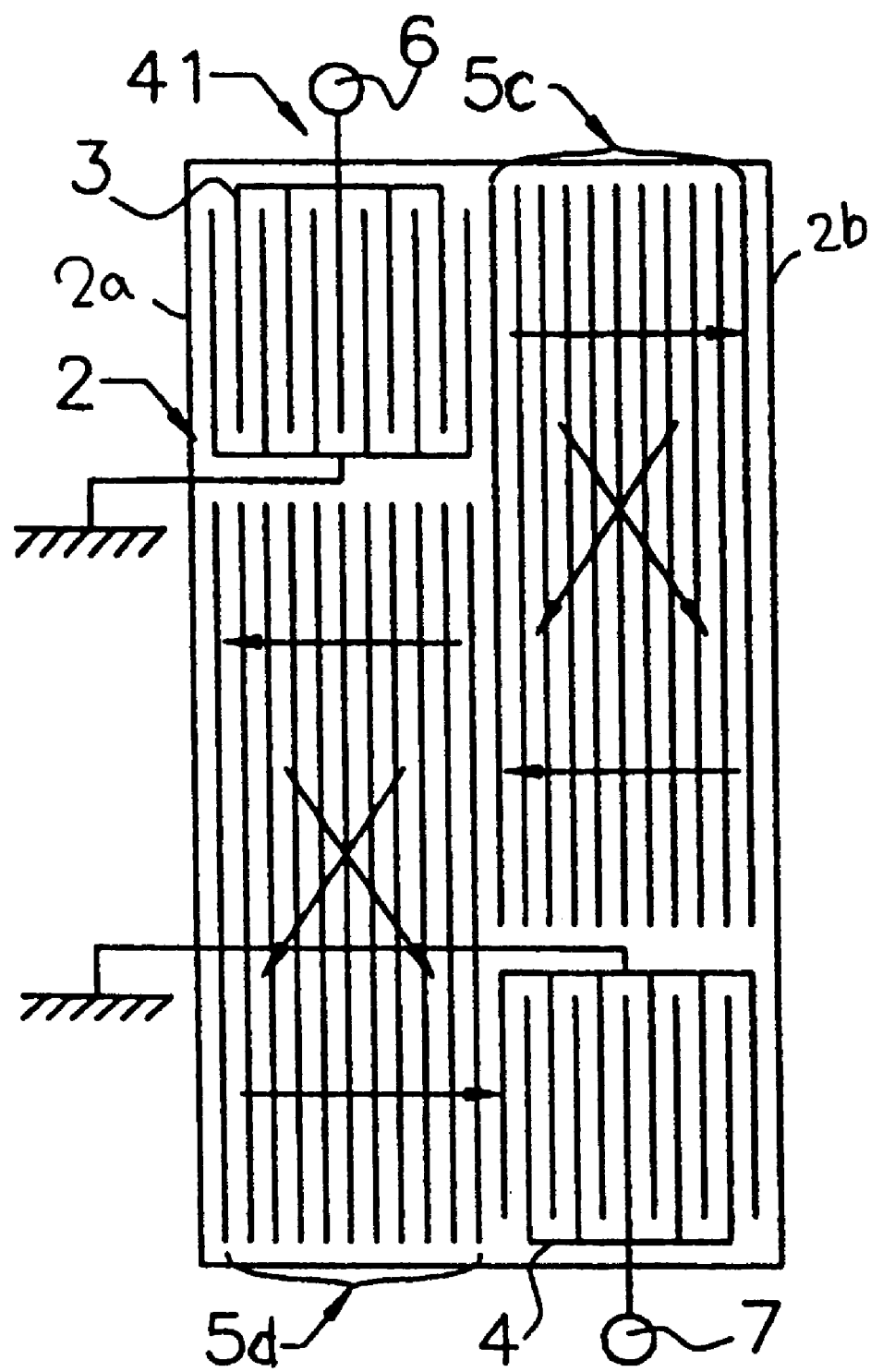
FIG. 6 is a plan view of a surface acoustic wave filter according to a fourth modification of the first preferred embodiment of the present invention.

Next, a fourth modification of the first preferred embodiment of the present invention will be illustrated with reference to FIG. 6. FIG. 6 is a plan view of a surface acoustic wave filter 41 according to the fourth modification. The same reference numerals are given to the same structural elements as those of the surface acoustic wave filter 1 shown in FIG. 1, and the detailed explanation thereof is omitted.

Unlike the structure of the surface acoustic wave filter 1 shown in FIG. 1, in this modified example, multistrip couplers 5c and 5d are provided on the piezoelectric substrate 2 as shown in FIG. 6. The multistrip couplers 5c and 5d are adjacent to each other at a certain position to be coupled, thereby constituting an integrated single multistrip coupler. That is, the multistrip couplers 5c and 5d work as portions of an integrated single multistrip coupler.

Figure 7:
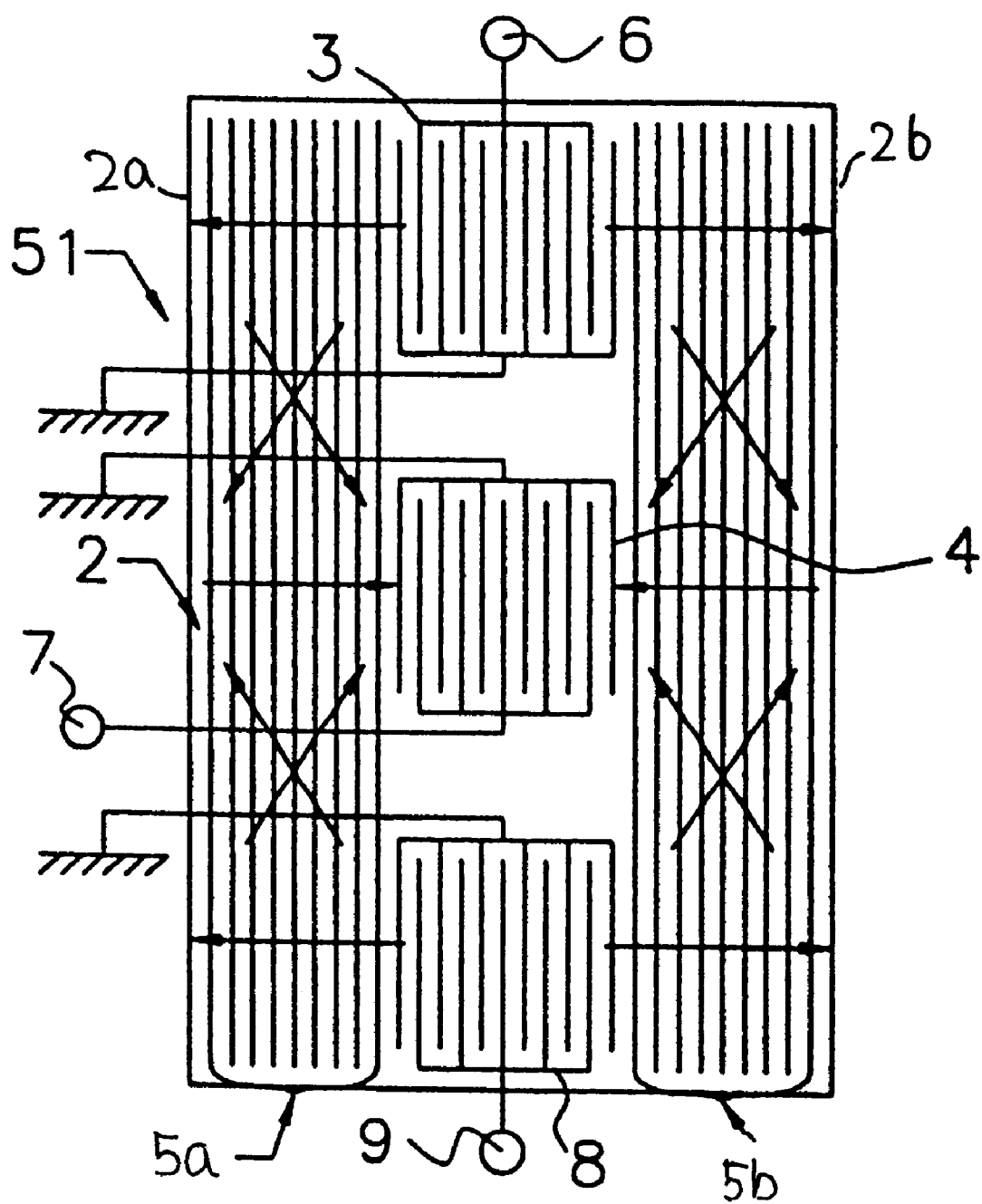
FIG. 7 is a plan view of a surface acoustic wave filter according to a fifth modification of the first preferred embodiments of the present invention.

Next, a fifth modification of the first preferred embodiment of the present invention will be illustrated with reference to FIG. 7. FIG. 7 is a plan view of a surface acoustic wave filter 51 according to the fifth modification. The same reference numerals are given to the same structural elements as those of the surface acoustic wave filter 1 shown in FIG. 1, and the detailed explanation thereof is omitted.

Unlike the structure of the surface acoustic wave filter 1 shown in FIG. 1, in this modification, multistrip couplers 5a and 5b are provided on each side of a first IDT 3 and a second IDT 4, and a third IDT 8 is disposed in a direction substantially perpendicular to the surface acoustic wave directions of the first IDT 3 and the second IDT 4.

As shown in FIG. 7, the third IDT 8 is disposed in the direction that is substantially perpendicular to the surface acoustic wave directions with respect to the first IDT 3 and the second IDT 4, and the multistrip couplers 5a and 5b are provided on each side of the first to third IDTs 3, 4, and 8. In addition, one of the comb-shaped electrodes of the third IDT 8 is connected to an input terminal 9, and the other comb-shaped electrode thereof is grounded.

With this structure, the first IDT 3 and the third IDT 8 can be used as inputs and insertion loss in the pass band of the filter is reduced more than that in the case of the surface acoustic wave filer 1 having only the first and second IDTs 3 and 4.

Furthermore, an input terminal 6 and the input terminal 9 are used as balanced input terminals. In this case, a balanced input-unbalanced output surface acoustic wave filter is obtained. In addition, in this modification, although the terminal connected to the first IDT 3 is used as an input terminal, the terminal connected to the second IDT 4 is used as an output terminal, and the terminal connected to the third IDT 8 is used as an input terminal, this is not the only arrangement applicable to the present invention. Depending on the situation and use, the terminals connected to the respective IDTs may be used either as input terminals or output terminals.

Figure 8:
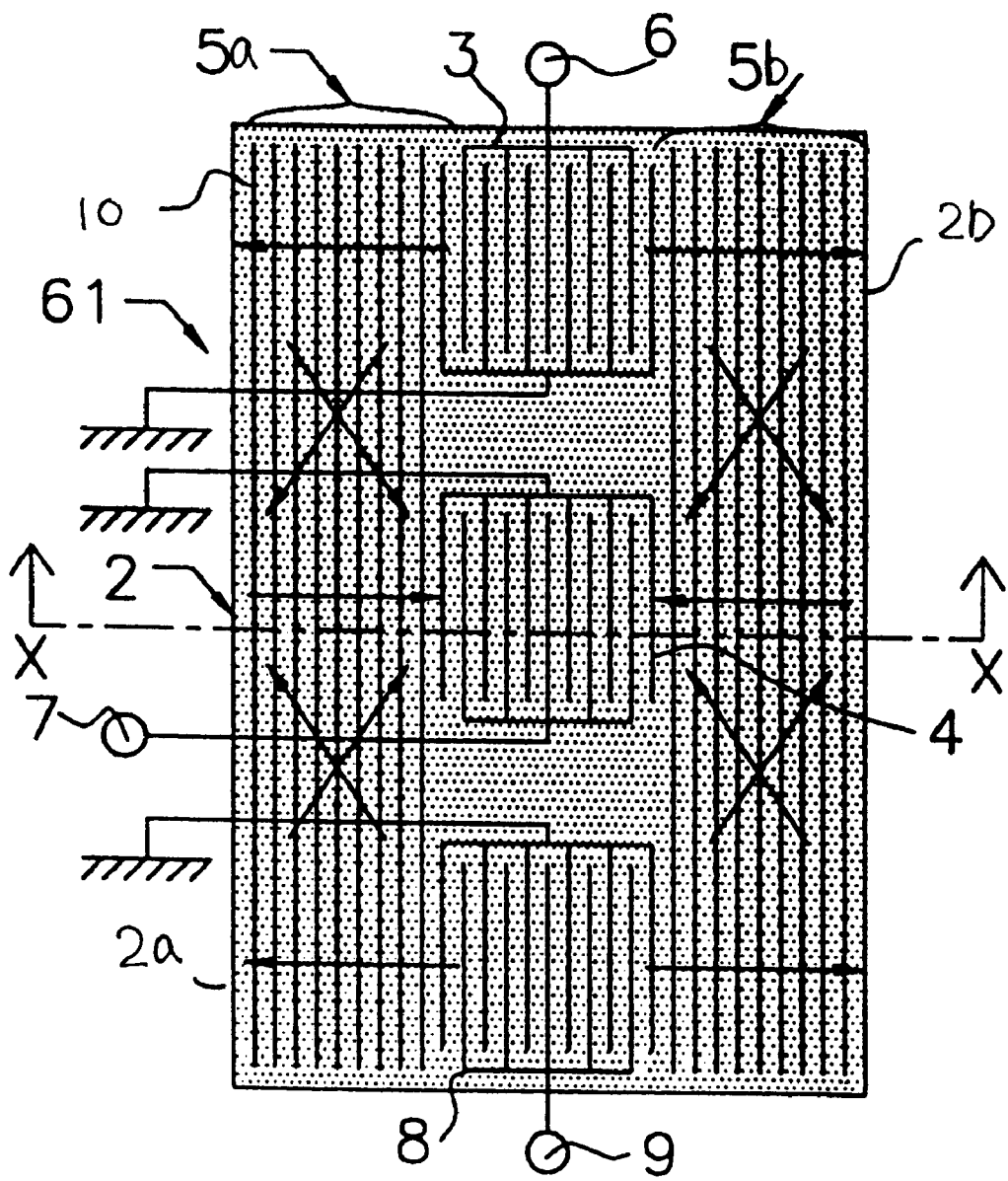
FIG. 8 is a plan view of a surface acoustic wave filter according to a second preferred embodiment of the present invention.
Figure 9:
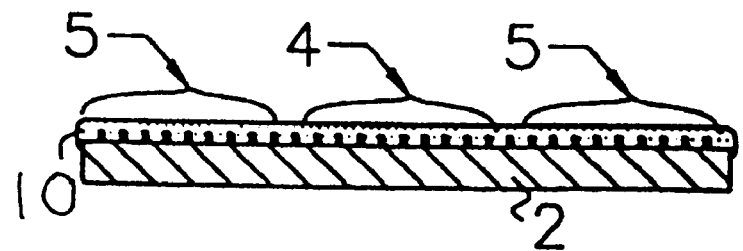
FIG. 9 is a sectional view taken by a line X—X of FIG. 8.

Next, a second preferred embodiment of the present invention will be illustrated with reference to FIGS. 8 and 9. FIG. 8 is a plan view of a surface acoustic wave filter 61 according to the second preferred embodiment of the present invention. FIG. 9 is a sectional view taken along line X—X of the filter shown in FIG. 8. The same reference numerals are given to those elements shown in the first preferred embodiment and the modified examples thereof, and the detailed explanation of the same elements is omitted.

Unlike the surface acoustic wave filter 51 shown in FIG. 7, in the surface acoustic wave filter 61 of the present preferred embodiment, gel resin 10 is applied on a piezoelectric substrate 2 including a first IDT 3, a second IDT 4, a third IDT 8, and a multistrip couplers 5a and 5b.

In this way, by applying the gel resin 10 to the first to third IDTs 3, 4, and 8, unnecessary excitation, reflection, and coupling are greatly reduced in the first to third IDTs 3, 4, 8, and the multistrip couplers 5a and 5b. As a result, unnecessary ripples and attenuation outside a desired band are reduced by about 10 dB.

In addition, as shown in FIG. 9, the gel resin 2a may reach a portion of the reflection end surface. However, since unnecessary excitation and reflection in the IDTs give the most significant influence, at least the IDTs are coated with the gel. resin. The gel resin used in various preferred embodiments of the present invention preferably has a low penetration number. For example, a resin with a Shore hardness of approximately 30 or less is preferably used.

Figure 10:
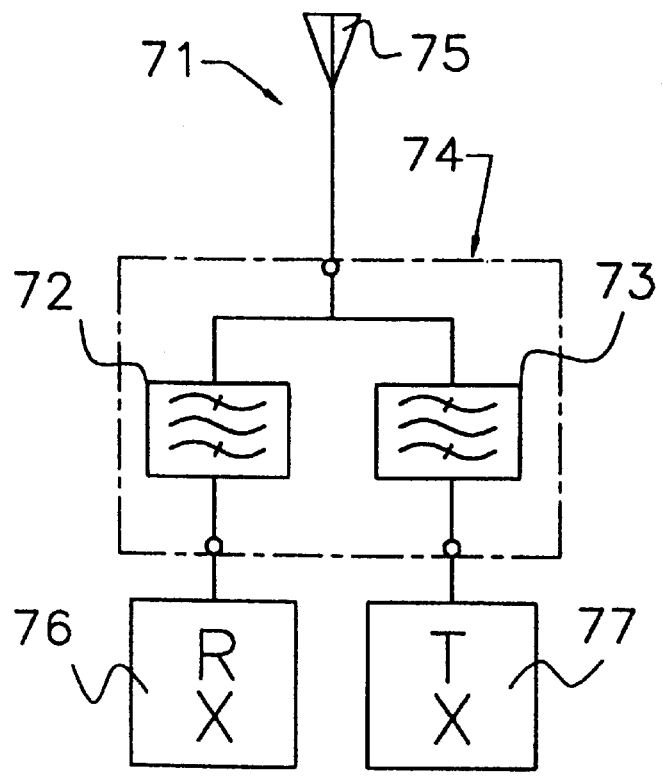
FIG. 10 is a block diagram of a duplexer according to a third preferred embodiment of the present invention and a communication apparatus according to,a fourth preferred embodiment thereof.
Figure 11:
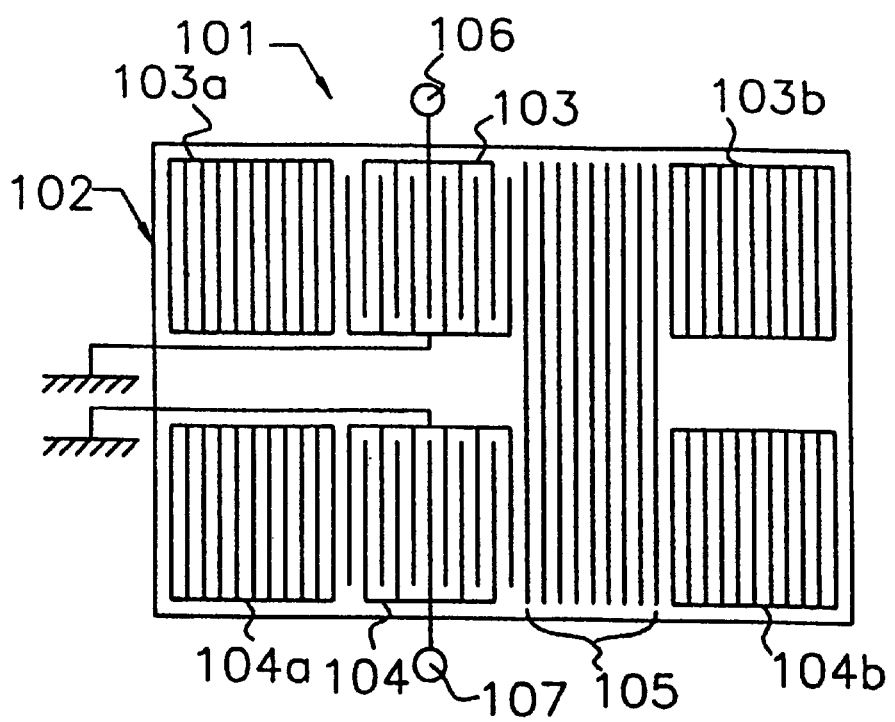
FIG. 11 is a plan view of a surface acoustic wave filter using a conventional multistrip coupler.

Next, third and fourth preferred embodiments of the present invention will be illustrated. FIG. 10 is a block diagram showing a duplexer of the third preferred embodiment and a communication apparatus of the fourth preferred embodiment.

As shown in FIG. 10, in a communication apparatus 71, an antenna terminal of a duplexer 74 having a receiving surface acoustic wave filter 72 and a transmitting surface acoustic wave filter 73 is connected to an antenna 75, an output terminal is connected to a reception circuit 76, and an input terminal is connected to a transmission circuit 77. As the receiving surface acoustic wave filter 72 and the transmitting surface acoustic wave filter 73 of the duplexer 74, one of the surface acoustic wave filters 1 to 61 or the combination thereof is preferably used.

In the first to third preferred embodiments, multistrip couplers are used as couplers. Alternatively, directional couplers in which a plurality of strip lines are electrically connected with each other may be employed.

Although the first to third preferred embodiments use piezoelectric ceramic as the piezoelectric substrates, this is not only the material applicable to the present invention. Alternatively, a piezoelectric substrate made of lithium tantalate, lithium niobate, lithium tetraborate, langasite, quartz, or other suitable material, may be used. Furthermore, a piezoelectric substrate produced by forming a piezoelectric film made of zinc oxide, aluminum nitride, or tantalum pentaoxide or other suitable material on a substrate made of glass or sapphire, or other suitable material, may be used.

In the first to third preferred embodiments, the first to third IDTs and the multistrip coupler are preferably made of aluminum. However, the material thereof is not limited to aluminum. Any of conductive materials such as gold, silver, copper, tungsten, tantalum, or other suitable material, can be used.

In addition, although the first to third preferred embodiments are used to define the surface acoustic wave filters as described above, the present invention is not limited to these. For example, the invention can be applied to a surface acoustic wave device such as a surface acoustic wave delay line. That is, this invention can be applied to all surface acoustic wave devices incorporating multistrip couplers.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:
1. A surface acoustic wave device comprising:
   a piezoelectric substrate;
   a first interdigital transducer provided on a surface of the piezoelectric substrate;
   a second interdigital transducer provided on the surface of the piezoelectric substrate such that the second interdigital transducer is offset from a direction in which a surface acoustic wave excited by th e first IDT propagates;
   a first edge provided on the piezoelectric substrate to reflect the excited surface acoustic wave to the first and second interdigital transducers; and
   a first coupler having a plurality of metal strips and disposed on the piezoelectric substrate, the first coupler provided between the first edge of the piezoelectric substrate and at least one of the first and second interdigital transducers so as to be adjacent to the first and second interdigital transducers; wherein
   the surface acoustic wave device operates using a shear horizontal surface acoustic wave and the first coupler is arranged to transmit shear horizontal surface acoustic waves without reflecting the shear horizontal surface acoustic waves; and
   said first edge is spaced from a center of the metal strip closest to said first edge at a distance that is substantially equal to an integer multiple of approximately W/2, where W is a sum of a width of the metal strip and a space between the metal strips.

2. A surface acoustic wave device according to claim 1, further comprising a second coupler on the piezoelectric substrate such that the first and second couplers are interposed between the first and second interdigital transducers.

3. A surface acoustic wave device according to claim 2, further comprising a third interdigital transducer located between the first coupler and the second coupler.

4. A surface acoustic wave device according to claim 3, wherein said first interdigital transducer is electrically connected to a first input terminal, and said third interdigital transducer is electrically connected to a second input terminal, said first and second input terminals constitute balanced input terminals.

5. A surface acoustic wave device according to claim 1, further comprising a second edge on the piezoelectric substrate opposite to said first edge of the piezoelectric substrate, wherein the second edge is located on a side of at least one of the first and second interdigital transducers where the first coupler is not provided, and the second edge is not perpendicular to the surface acoustic wave propagating direction.

6. A surface acoustic wave device according to claim 1, further comprising a resin film covering the first and second interdigital transducers.

7. A surface acoustic wave device according to claim 5, wherein said resin film is a gel resin having a Shore hardness of approximately 30 or less.

8. A surface acoustic wave device according to claim 1, wherein said piezoelectric substrate Includes a second edge opposite to said first edge of said piezoelectric substrate, at least one of said first and second interdigital transducers has an edge which is flush with said second edge of said piezoelectric substrate.

9. A communication apparatus comprising:
   at least one surface acoustic wave device including:
      a piezoelectric substrate;
      a first interdigital transducer provided on a surface of the piezoelectric substrate;
      a second interdigital transducer provided on the surface of the piezoelectric substrate such that the second interdigital transducer is offset from a direction in which a surface acoustic wave excited by the first IDT propagates;
      a first edge provided on the piezoelectric substrate to reflect the excited surface acoustic wave to the first and second Interdigital transducers; and
      a first coupler having a plurality of metal strips and disposed on the piezoelectric substrate, the first coupler provided between the first edge of the piezoelectric substrate and at least one of the first and second interdigital transducers so as to be adjacent to the first and second interdigital transducers; wherein
         the surface acoustic wave device operates using a shear horizontal surface acoustic wave and the first coupler is arranged to transmit shear horizontal surface acoustic waves without reflecting the shear horizontal surface acoustic waves; and
         said first edge is spaced from a center of the metal strip closest to said first edge at a distance that is substantially equal to an Integer multiple of approximately W/2, where W is a sum of a width of the metal strip and a space between the metal strips.

10. A communication apparatus according to claim 9, further comprising a second coupler on the piezoelectric substrate such that the first and second couplers are interposed between the first and second interdigital transducers.

11. A communication apparatus according to claim 10, further comprising a third interdigital transducer located between the first coupler and the second coupler.

12. A communication apparatus according to claim 9, further comprising a second edge on the piezoelectric substrate opposite to said first edge of the piezoelectric substrate, wherein the second edge is located on a side of at least one of the first and second interdigital transducers where the first coupler is not provided, and the second edge is not perpendicular to the surface acoustic wave propagating direction.

13. A communication apparatus according to claim 9, further comprising a resin film covering the first and second interdigital transducers.

* * * * *